United States Patent [19]
Campisano et al.

[11] Patent Number: 5,580,663
[45] Date of Patent: Dec. 3, 1996

[54] ELECTRO-LUMINESCENT MATERIAL, SOLID STATE ELECTRO-LUMINESCENT DEVICE AND PROCESS FOR FABRICATION THEREOF

[75] Inventors: Salvatore U. Campisano; Salvatore Lombardo; Giuseppe Ferla, all of Catania, Italy; Albert Polman, Amsterdam; Gerard N. Van Den Hoven, Ede, both of Netherlands

[73] Assignee: Consorzio per la Ricerca sulla Microelettronica nel Mezzogiorno, Catania, Italy

[21] Appl. No.: 316,045

[22] Filed: Sep. 30, 1994

[30] Foreign Application Priority Data

Oct. 20, 1993 [EP] European Pat. Off. .............. 93830421

[51] Int. Cl.$^6$ .............................. B32B 9/04; C09K 11/59
[52] U.S. Cl. .................... 428/446; 428/688; 428/689; 428/690; 428/699; 428/702; 428/704; 428/917; 252/301.4 R; 427/527; 427/529
[58] Field of Search .................. 428/688, 689, 428/690, 699, 702, 704, 917, 195, 210, 446; 252/301.4 R; 427/523, 526, 527, 529

[56] References Cited

U.S. PATENT DOCUMENTS 3,634,711  1/1972  Barber et al. .
5,249,195  9/1993  Feldman et al. ........................ 372/45
5,322,813  6/1994  Beach ...................................... 437/88
5,363,398  11/1994  Glass et al. ............................. 372/92

OTHER PUBLICATIONS

Ennen, H.; Pomrenke, G.; Axmann, A.; Eisele, K.; Haydl, W.; Schneider, J. "1.54–μm electroluminescence of erbium-–doped silicon grown by molecular beam epitaxy," *Applied Physics Letters* 46(4):381–383, 1985.

Favennec, P. N.; L'Haridon, H.; Moutonnet, D.; Salvi, M.; Gauneau, M. "Optical activation of $Er^{3+}$ implanted in silicon by oxygen impurities," *Japanese Journal of Applied Physics* 29(4):L524–L526, 1990.

*Primary Examiner*—Patrick Ryan
*Assistant Examiner*—Marie R. Yamnitzky
*Attorney, Agent, or Firm*—David V. Carlson; Clarence T. Tegreene; Seed and Berry LLP

[57] ABSTRACT

An electro-luminescent material and solid state electro-luminescent device comprising a mixed material layer formed of a mixture of silicon and silicon oxide doped with rare earth ions so as to show intense room-temperature photo- and electro-luminescence is described. The luminescence is due to internal transitions of the rare earth ions. The mixed material layer has an oxygen content ranging from 1 to 65 atomic % and is produced by vapor deposition and rare earth ions implant. A separated implant with elements of the V or III column of the periodic table of elements gives rise to a PN junction. The so obtained structure is then subjected to thermal treatment in the range 400°–1100° C.

18 Claims, 3 Drawing Sheets

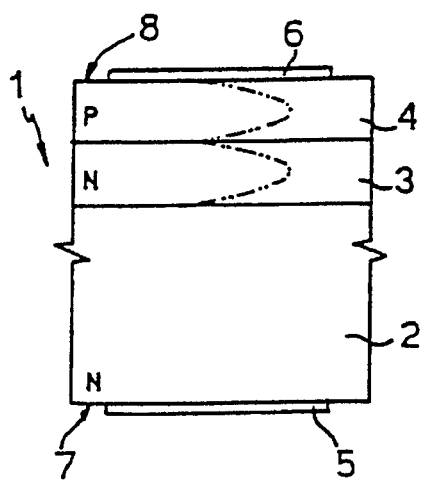
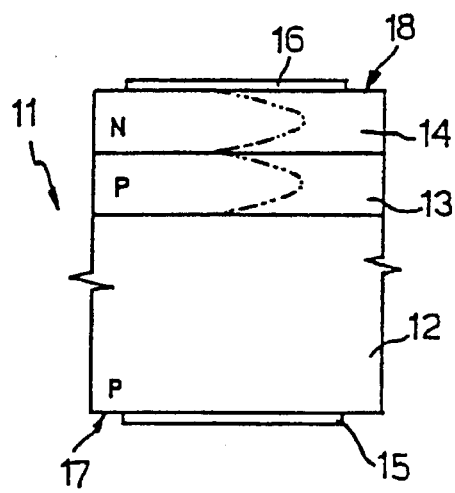
Fig. 1   Fig. 2
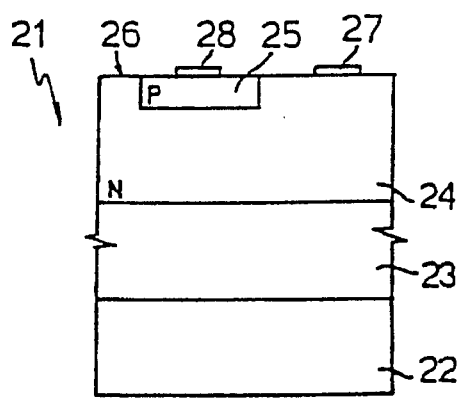
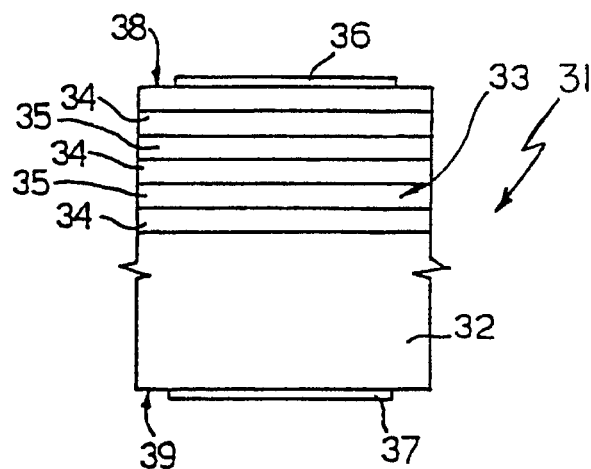
Fig. 3   Fig. 4
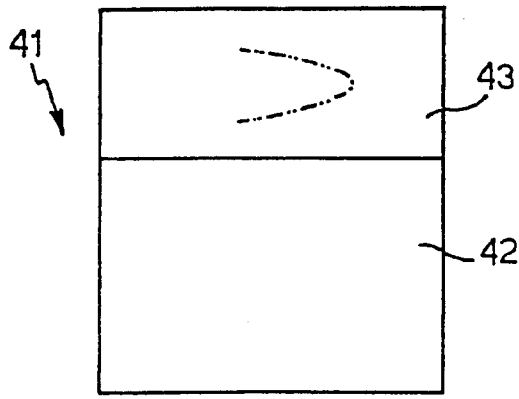
Fig. 5

ELECTRO-LUMINESCENT MATERIAL, SOLID STATE ELECTRO-LUMINESCENT DEVICE AND PROCESS FOR FABRICATION THEREOF

TECHNICAL FIELD

The present invention relates to an electro-luminescent material, to a solid state electro-luminescent device and to the process for fabrication thereof.

BACKGROUND OF THE INVENTION

As known, the use of silicon for manufacturing optoelectronic devices is limited since the indirect band gap of silicon does not allow efficient photon emission. The doping of silicon with erbium ions can result in intense luminescence only at low temperatures, near the liquid nitrogen boiling point (77° K). Moreover, it is known that the doping of silicon dioxide with erbium allows room temperature photo-luminescence. However, with erbium-doped silicon dioxide, it is not possible to observe luminescence produced by carrier transport (electro-luminescence) because of the insulating nature of silicon oxide.

Finally, a detailed analysis of the luminescence effects in erbium doped single crystal silicon indicates that optoelectronic application of this material is severely limited by the small solid solubility of erbium in silicon grown either by Czochralski or by float zone techniques.

Nowadays, photon-emitting devices are usually fabricated using compound semiconductors, such as GaAs or similar. However, technological processing of these materials is severely limited by the out diffusion of one of the constituents, which determines the loss of stoichiometry for thermal processes at intermediate temperatures. These materials, moreover, are not well suited for typical planar technology processes which are based on the properties of silicon dioxide. Diffusion barriers, insulating layers and all the other functions of silicon dioxide are replaced by deposited layers, characterized by physical-chemical performances which are worse than those of thermal silicon oxide.

Furthermore, the cost of compound semiconductor substrates is much higher than the cost of silicon wafers and the present production is unable to supply wafers whose size reaches the diameter of silicon wafers, currently of 200 mm. Such a limitation implies a smaller number of devices being fabricated in a single set of processes and thus still higher costs for each device.

SUMMARY OF THE INVENTION

The aim of the present invention is to provide a silicon based electro-luminescent material and a solid state device solving the problems encountered in the prior art.

According to the present invention, there is provided an electro-luminescent material comprising a mixed material formed by a mixture of silicon and silicon oxide doped with rare earth ions. In another embodiment, a solid state electro-luminescent device comprises a PN junction formed by a first region of electro-luminescent material, including a mixture of silicon and silicon oxide doped with rare earth ions and at least one second region of a mixed material formed by a mixture of silicon and silicon oxide doped with dopant elements of the V or III column of the periodic table of elements.

The present material is thus a mixture of silicon and silicon oxide which has an electrical conductivity large enough to get carrier transport, can be doped with rare earth ions and can be treated with thermal processes which allow luminescence. This material combines the advantages of silicon, as a semiconductor, and of silicon oxide as a host for rare earth ions, showing room temperature luminescence.

Preferred non-limiting embodiments of the present invention will be described by way of an example with reference to the accompanying drawings.

BRIEF DESCRIPTION OF THE DRAWINGS

FIG. 1 is a cross-section of an embodiment of the present electro-luminescent device according to the invention.

FIG. 2 is a cross-section of a second embodiment of an electro-luminescent device according to the invention.

FIG. 3 is a cross-section of a third embodiment of an electro-luminescent device according to the invention.

FIG. 4 is a cross-section of a fourth embodiment of an electro-luminescent device according to the invention.

FIG. 5 is a cross-section of a sample formed by the present electro-luminescent material and used for carrying out tests on photo- and electro-luminescence.

DETAILED DESCRIPTION OF THE INVENTION

Figure 6:
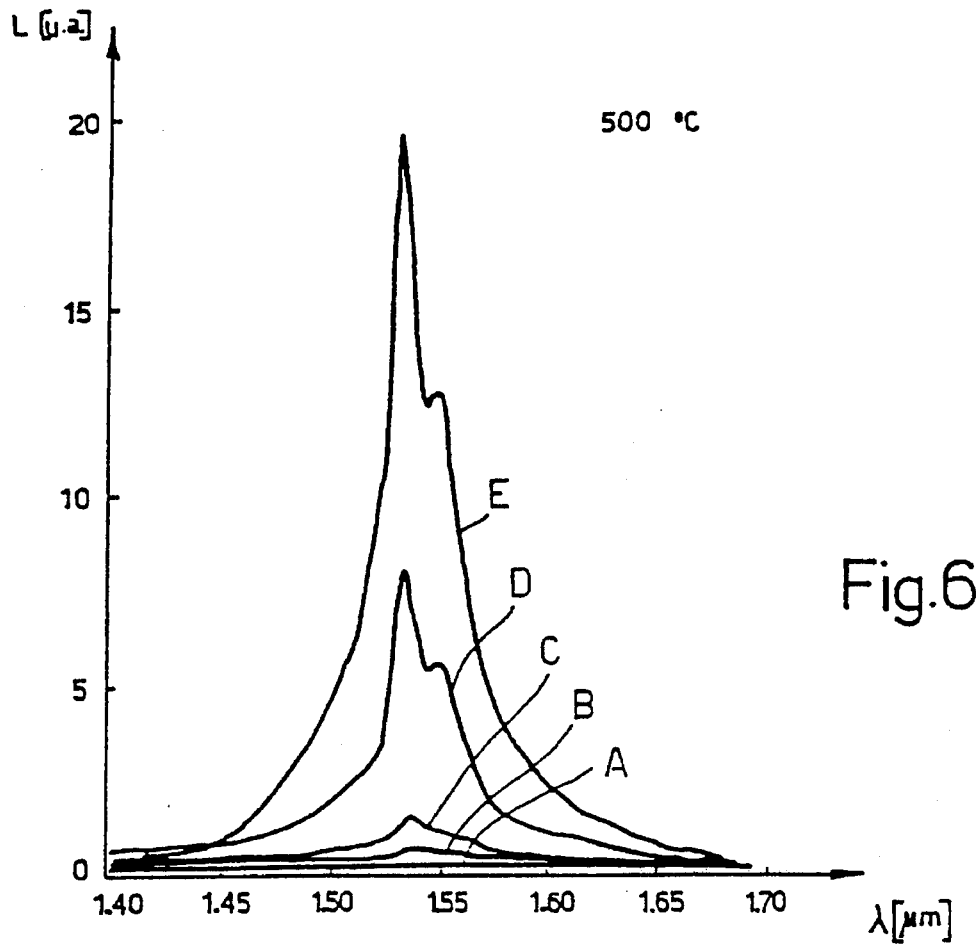
FIG. 6 is a diagram of emitted radiation spectra for different oxygen contents.

FIG. 1 shows a cross section of a solid state electro-luminescent device 1 integrated in a chip. The device 1 comprises a stack formed by an N-type silicon substrate 2, an N-type region 3 (doped with erbium), and a P-type region 4 (doped with boron). Contacts 5 and 6 are deposited on surfaces 7 and 8 formed by the substrate 2 and P-type region 4, respectively.

Regions 3 and 4 are obtained from a single mixed material layer formed of a mixture of silicon and silicon oxide, whose oxygen content may be varied between 1 to 65 atomic %. Such a mixed material, also called SIPOS (Semi Insulating Polycrystalline Silicon), has previously been used for passivation processes, for example for fabricating field plates of power devices, but has never been proposed for optoelectronic applications when doped with rare earth ions. Regions 3 and 4 are thus obtained by suitable doping such SIPOS material. In particular, region 3 is obtained by doping such mixed material with erbium and region 4 is obtained by doping with boron.

A sequence of steps for fabricating the structure of FIG. 1 is the following.

Initially, a silicon wafer, of N-type and any orientation, is introduced in a Chemical Vapor deposition system (not shown). The wafer temperature is raised to a value suitable to obtain deposition, e.g., 550°–700° C.; then the wafer is exposed to a flow of gases that allow the deposition of silicon and silicon oxide (typically $SiH_4$ and $N_2O$). The gas flow ratio is controlled by a mass flow controller and preferably adjusted in such a way as to obtain layers whose oxygen content may be varied from 1 to 65 atomic %. In one embodiment, the SIPOS layers are about 1 μm and deposited at 620° C. In this embodiment, varying the $SiH_4/N_2O$ flow ratio resulted in oxygen contents ranging from 4 atomic % to 27 atomic %.

After deposition, the wafer may be thermally processed at intermediate temperatures in order to stabilize the structure of the layer. For example, it may be annealed at 920° C. for 30 minutes in an $O_2$ atmosphere.

The wafer is then introduced in an ion accelerator and implanted with erbium ions with concentrations in the range $1\times10^{14}$ to $1\times10^{16}$ ions/cm$^2$. In one embodiment, the ions were implanted in a concentration of $2\times10^{15}$ ions/cm$^2$. The implant energy is 500 KeV. However, the implant energy may be varied in order to obtain predetermined concentration profiles. Other erbium doses may also be used. The $2\times10^{15}$ ions/cm$^2$ implantations resulted in Gaussian implantation profiles peaked at approximately 150 nm depth with a full width at half maximum of about 100 nm as measured by Rutherford backscattering spectroscopy. The wafers may also be annealed in a vacuum (about $4\times10^{-7}$ mbar), for example, at temperatures from 300°–1000° C.

The wafer is further implanted with low energy boron ions (about 30 KeV) in order to form a PN junction. Thereafter, the wafer is introduced in a furnace at a suitable temperature (e.g., in the range 400°–1100° C.) in order to reduce radiation damage and to activate the introduced dopants. Thereby, regions 3 and 4 are formed, with the dopant concentration profiles schematically shown in FIG. 1 with dash-and-dot lines. Then the wafer is subjected to other known fabrication processes, such as contact deposition for obtaining contacts 5, 6 for completing fabrication.

FIG. 2 shows a different embodiment of the present device, indicated at 11, including a P-type silicon substrate 12, a P-type region 13, an N-type region 14 and contacts 15, 16 on surfaces 17, 18. The fabrication process of device 11 is similar to the above described one, with the following differences. The substrate 12 is of P-type; the boron implant is made at higher energy, in order to locate boron near the substrate and, the erbium implant is made at low energy in order to form the N-type region 14 close to the surface 18.

In FIG. 3, the device 21 includes a silicon substrate 22; a silicon oxide layer 23 on substrate 22; an N-type region 24 on oxide layer 23; a P-type region 25 embedded in region 24, except for its upper face forming, together with upper face of region 24, surface 26 of the device; and contacts 27, 28 to region 24 and region 25, respectively. The fabrication process of device 21 differs from the process for fabricating device 1 in that the SIPOS material is deposited onto an insulated substrate (including layer 23 or other layers of insulating material), the boron implant is carried out through a mask which limits the area of region 25, and both contacts 27, 28 are formed on the same device surface (surface 26) so as to contact region 24 and region 25, respectively.

In FIG. 4, the mixed material region is different from that of FIGS. 1 to 3. In particular, device 31 comprises a silicon substrate 32 and multilayer region 33 formed by a stack of very thin layers, including oxide or SIPOS layers 34 and silicon layers 35, laid one on the other, in turns. As an example, layers 34, 35 may have a thickness of about 100Å. Multilayer region 33 is equivalent to the starting mixed material region of devices 1, 11 or 21 and thus may be doped as described above for such devices. The device 31 has contacts 36, 37 on top and bottom surfaces 38, 39, as shown. The device 31 may alternatively have contacts only on top surface 38.

Of course, the above described fabrication processes may also vary from what has been described in that the implantation processes may be made before the thermal process required to stabilize the material, instead of after that process. Also, the implantation processes may be done on wafers which have been previously processed and the deposited mixed material region may have an oxygen content ranging from 1 to 65 atomic %.

Photo-luminescence of the SIPOS material doped with erbium has been detected at temperatures up to 300° K in samples whose structure (indicated at 41) is shown in FIG. 5 and includes a single crystal silicon substrate 42 and a SIPOS layer 43 doped with erbium so as to obtain a layer having an erbium concentration profile represented schematically by dash-and-dotted line.

In the tests, samples 41 have been illuminated with green light emitted by a 2 W argon laser and the luminescence has been revealed through a monochromator and an IR detector. The emitted radiation spectrum is shown in FIG. 6 for different average oxygen contents. In particular, curve A is relative to a reference sample obtained by doping with erbium a single crystal silicon sample (that is, without layer 43); curve B has been obtained by a sample having the structure of FIG. 5, wherein the oxygen content of layer 43 was 4 atomic %; curve C is relative to a sample having an oxygen content of 11 atomic %; curve D is relative to a sample having an oxygen content of 27 atomic %; and curve E is relative to a sample wherein layer 43 was formed only by silicon oxide. It is evident that erbium doping of a single crystal silicon layer (curve A) does not produce any appreciable room temperature photo-luminescence, while the peak intensity at 1.535 μm grows more than linearly with the oxygen content in SIPOS films.

Figure 7:
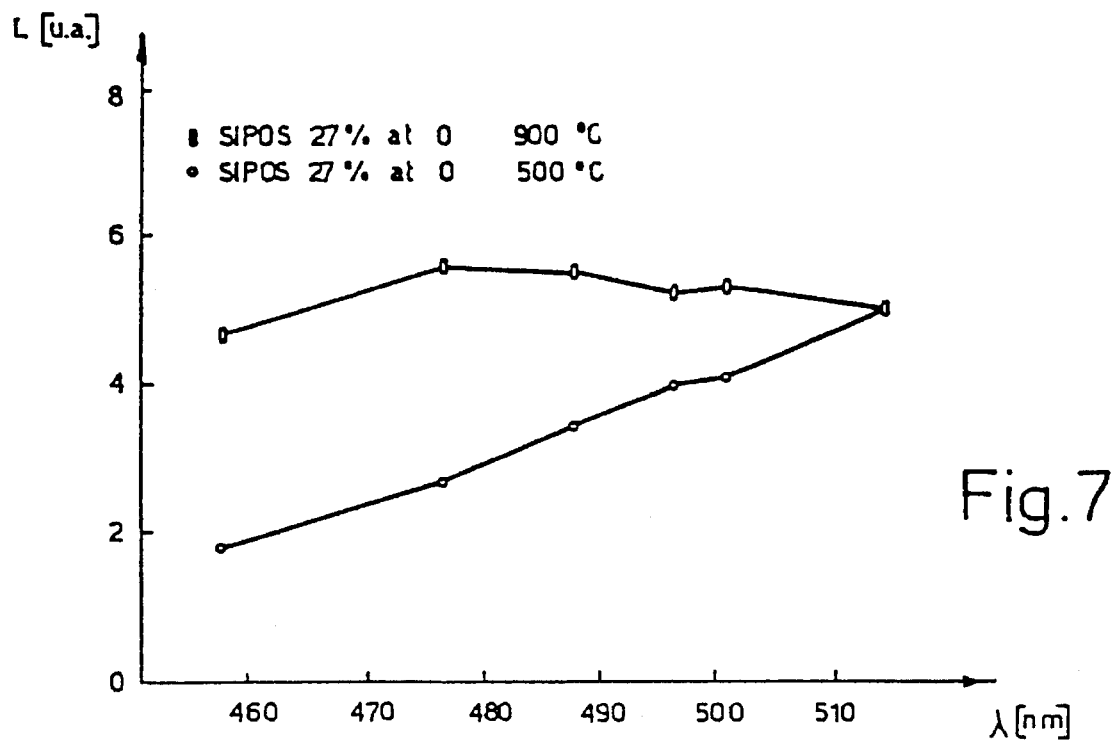
FIG. 7 is a graph of luminescence versus the pump wavelength for different anneal temperatures.

Luminescence L at 1.535 μm has been also measured as a function of laser pump wavelength and the results are reported in FIG. 7 for two different anneal temperatures (500° C. and 900° C.). The weak dependence of luminescence on the pump laser wavelength is a clear indication that luminescence is produced by electrical carriers injected by the pump laser.

Figure 8:
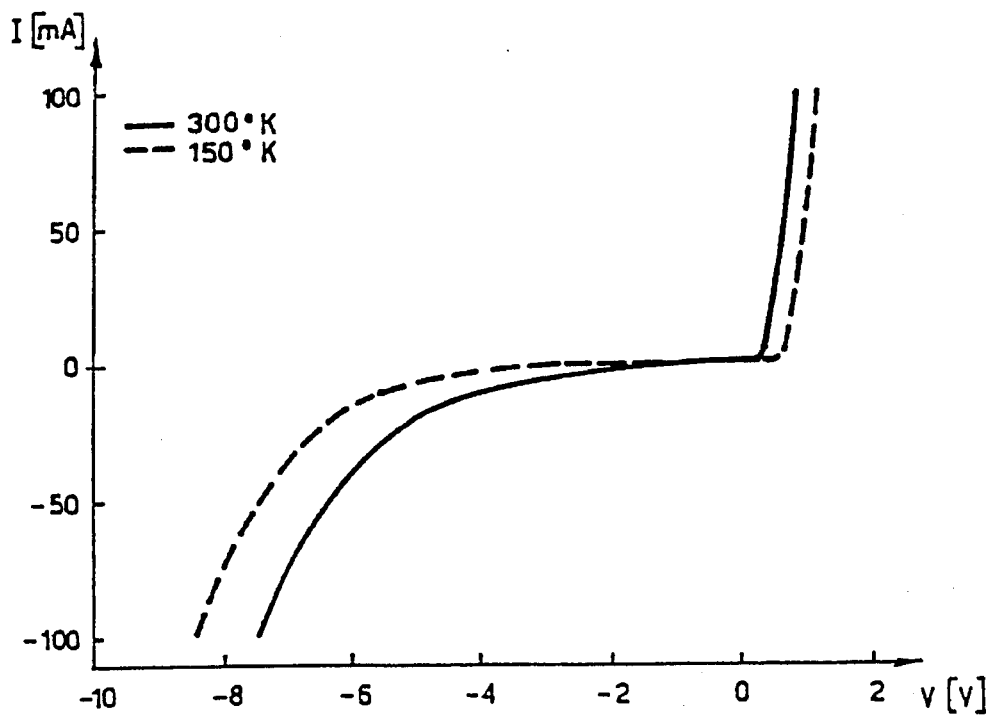
FIG. 8 is a graph of current-voltage characteristics for two different temperatures.

Electro-luminescence measurements were made using device 1 shown in FIG. 1. The thickness of the SIPOS layer (equal to the sum of the thickness of regions 3 and 4) was about 0.25 μm. The current/voltage characteristics resulting from the test are reported in FIG. 8 for two different temperatures. As can be seen, the measured characteristics show the typical diode behavior, indicating the bipolar conduction mechanism. Similar diode characteristics have been obtained by doping the SIPOS material with As/B and P/B.

In the electro-luminescence test, the device was introduced in an electro-luminescence measuring apparatus similar to that previously described for photo-luminescence tests, with the addition of a heat sink, in order to remove the energy produced by Joule heating, and of a power supply for biasing the diode.

Figure 9:
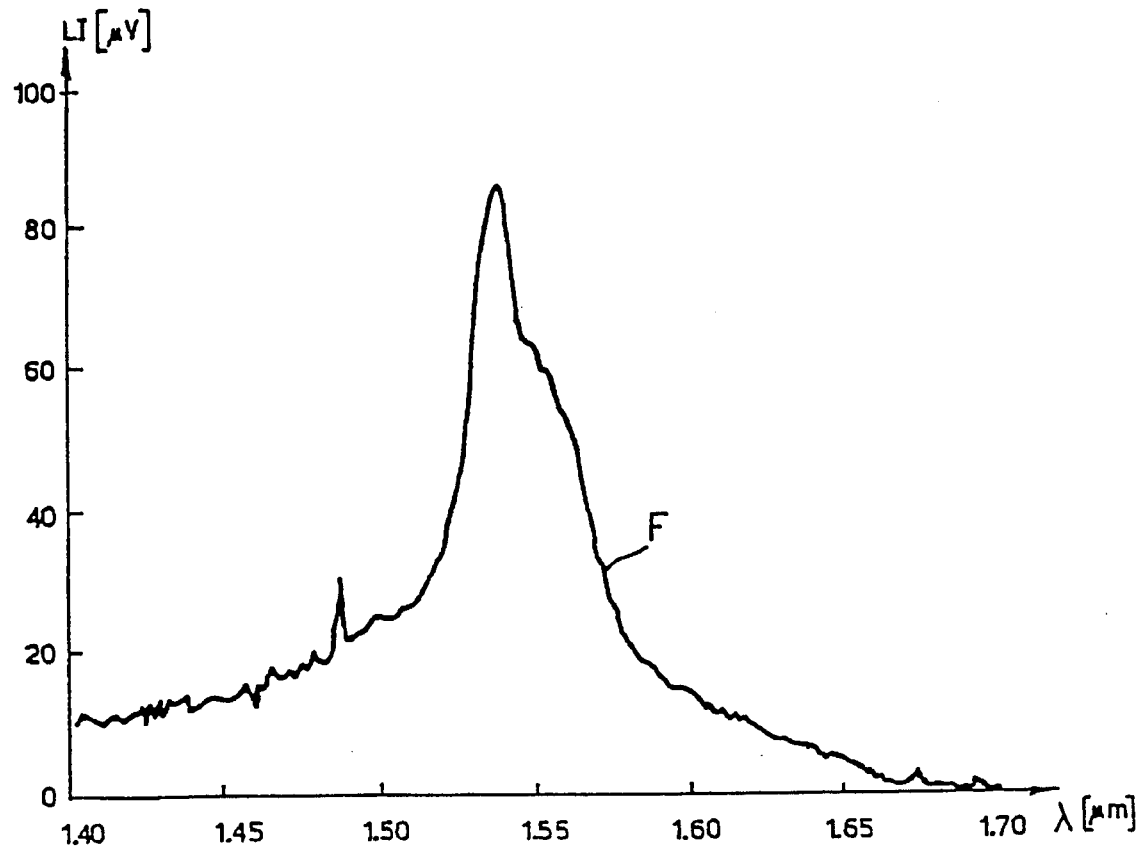
FIG. 9 is a spectrum of infrared radiation at room temperature.

FIG. 9 shows the spectrum of the emitted infrared radiation obtained at room temperature and for a measured current of 8.6 mA (curve F).

The revealed photo/electroluminescence may be explained as follows: electron/hole pairs are injected in silicon by either the incident light (photo-luminescence) or charge injection in the biased diode (electroluminescence). The electron/hole pairs recombine producing an intra-4f transition of $Er^{3+}$ and thus luminescence at about 1.54 μm wavelength.

It has thus been demonstrated that by using a mixed material of silicon/silicon oxide doped with erbium and/or other dopants (rare earth ions) suitable to modulate the conductivity of the material it is possible to obtain intense room-temperature photo- and electroluminescence in the infrared. The described material or the junction device obtained therewith can thus be used as opto-electronic component either in a hybrid or in an integrated circuit.

To those skilled in the art it will be clear that changes may be made to the material, to the device and to the fabrication process. In particular, it is underlined that, instead of doping the mixed material with erbium, it is possible to dope the mixed material with other rare earth elements, to obtain luminescence at different wavelengths. The sequence of the doping steps required to obtain the PN junction also may be inverted with respect to the above description. As already indicated, the mixed material may be formed as a casual mixture of silicon and silicon oxide or as an orderly stack of thin films of silicon and silicon oxide or silicon and SIPOS. The content of oxygen may vary, as well as the technique for depositing the mixed material (e.g., by physical or chemical deposition, by ion implantation or other similar techniques).

We claim:

1. An electro-luminescent material, characterized in that it comprises a mixed material formed by a mixture of silicon and silicon oxide, the mixed material being doped with rare earth ions, wherein the oxygen content of said mixed material is in the range 1 to 65 atomic %.

2. A material according to claim 1 characterized in that said rare earth ions are erbium ions.

3. A material according to claim 1 characterized in that said mixture of silicon and silicon oxide comprises mutually stacked layers of silicon and silicon oxide, each doped with rare earth ions.

4. A material according to claim 3 characterized in that said rare earth ions are erbium ions.

5. A composite material, characterized by mutually stacked layers of silicon and a mixed material formed by a mixture of silicon and silicon oxide, the layers of mixed material being doped with rare earth ions, the composite material including a plurality of the layers of silicon and a plurality of the layers of mixed material.

6. A material according to claim 5 characterized in that said rare earth ions are erbium ions.

7. A material according to claim 5 wherein the oxygen content of said mixed material is in the range of 1 to 65 atomic %.

8. A process for fabricating an electro-luminescent material characterized by the steps of:

forming a mixed material layer including a mixture of silicon and silicon oxide on a substrate; and doping said mixed material layer with rare earth ions;

wherein the oxygen content of said mixed material layer is in the range 1 to 65 atomic %.

9. A process according to claim 8 wherein said rare earth ions are erbium ions.

10. A process according to claim 8, further comprising the step of thermally processing said mixed material layer for stabilization.

11. A process according to claim 10 wherein said step of forming a mixed material layer comprises chemical or physical vapor deposition or ion implantation of silicon and silicon oxide.

12. A process according to claim 10 wherein said step of forming a mixed material layer comprises the step of depositing a stack of silicon layers and silicon oxide layers overlaid in turns and the step of doping said mixed material layers includes doping the silicon layers and the silicon oxide layers.

13. A composite electro-luminescent material comprising stacked thin layers of silicon and layers of mixed material, the mixed material including a mixture of silicon and silicon oxide doped with rare earth ions formed by the process of claim 8.

14. A process according to claim 8 wherein said step of forming a mixed material layer comprises chemical or physical vapour deposition or ion implantation of silicon and silicon oxide.

15. A process according to claim 14 wherein said step of forming a mixed material layer comprises the step of depositing a stack of thin silicon layers and thin silicon oxide layers overlaid in turns.

16. An electro-luminescent material made by the process of claim 8.

17. A process for fabricating a composite electro-luminescent material including stacked thin layers of silicon and layers of mixed material formed from a mixture of silicon and silicon oxide doped with rare earth ions, characterized by the steps of:

depositing, on a substrate, the stack of silicon layers and mixed material layers including a mixture of silicon and silicon oxide; and doping said stack by doping said mixed material layers with rare earth ions;

wherein the oxygen content of said mixed material is in the range 1 to 65 atomic %.

18. A composite electro-luminescent material made by the process of claim 17.

* * * * *